(12) United States Patent
Abe

(10) Patent No.: US 11,402,921 B2
(45) Date of Patent: Aug. 2, 2022

(54) OPERATION CONTROL APPARATUS

(71) Applicant: ALPINE ELECTRONICS, INC., Tokyo (JP)

(72) Inventor: Keisuke Abe, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 17/186,319

(22) Filed: Feb. 26, 2021

(65) Prior Publication Data

US 2021/0303076 A1   Sep. 30, 2021

(30) Foreign Application Priority Data

Mar. 31, 2020   (JP) .............................. JP2020-063631

(51) Int. Cl.
| | | |
|---|---|---|
| *G06F 3/01* | (2006.01) | |
| *B60K 35/00* | (2006.01) | |
| *G06F 3/14* | (2006.01) | |
| *G06F 3/147* | (2006.01) | |
| *G06F 3/044* | (2006.01) | |
| *G06F 3/041* | (2006.01) | |

(52) U.S. Cl.
CPC ............. *G06F 3/017* (2013.01); *B60K 35/00* (2013.01); *G06F 3/044* (2013.01); *G06F 3/0416* (2013.01); *G06F 3/1423* (2013.01); *B60K 2370/1464* (2019.05); *G06F 3/147* (2013.01); *G06F 2203/04108* (2013.01)

(58) Field of Classification Search
None
See application file for complete search history.

(56) References Cited

U.S. PATENT DOCUMENTS

| | | | | |
|---|---|---|---|---|
| 8,677,284 | B2* | 3/2014 | Aguilar | G06F 3/04883 |
| | | | | 715/863 |
| 9,140,574 | B2* | 9/2015 | Takada | G01C 21/367 |
| 9,218,076 | B2* | 12/2015 | Nagahara | G06F 3/041 |
| 9,323,437 | B2* | 4/2016 | Harada | G06F 3/04845 |
| 10,296,105 | B2* | 5/2019 | Fujimaki | G06F 3/017 |
| 10,346,118 | B2* | 7/2019 | Kumon | G01C 21/3664 |
| 2016/0104313 | A1* | 4/2016 | Du | G06F 3/0346 |
| | | | | 348/51 |
| 2021/0188090 | A1* | 6/2021 | Kim | B60K 37/02 |

FOREIGN PATENT DOCUMENTS

JP   2016-009300   1/2016

* cited by examiner

*Primary Examiner* — Duane N Taylor, Jr.
(74) *Attorney, Agent, or Firm* — Crowell & Moring LLP

(57) ABSTRACT

A spatial sensing region is set in accordance with a spatial sensing function of a first operation detection unit included in a first operation device, and another spatial sensing region is set in accordance with a spatial sensing function of a second operation detection unit included in a second operation device. The first operation device and the second operation device are arranged in a vehicle interior. For example, when the second operation detection unit of the second operation device detects a forward movement of a hand, it is determined that an operator intends to operate the first operation device and control is performed such that a display screen of the first operation device is turned on, for example.

20 Claims, 5 Drawing Sheets

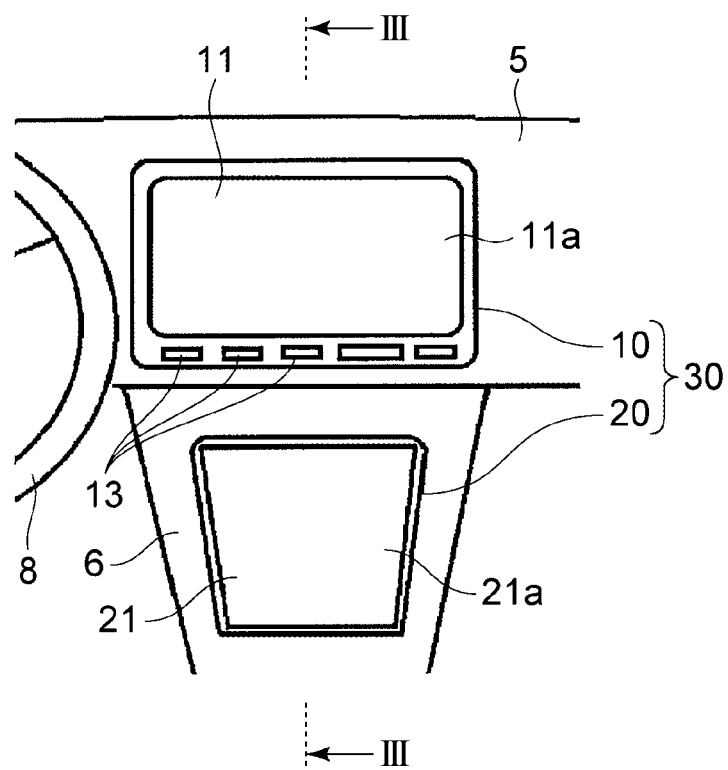
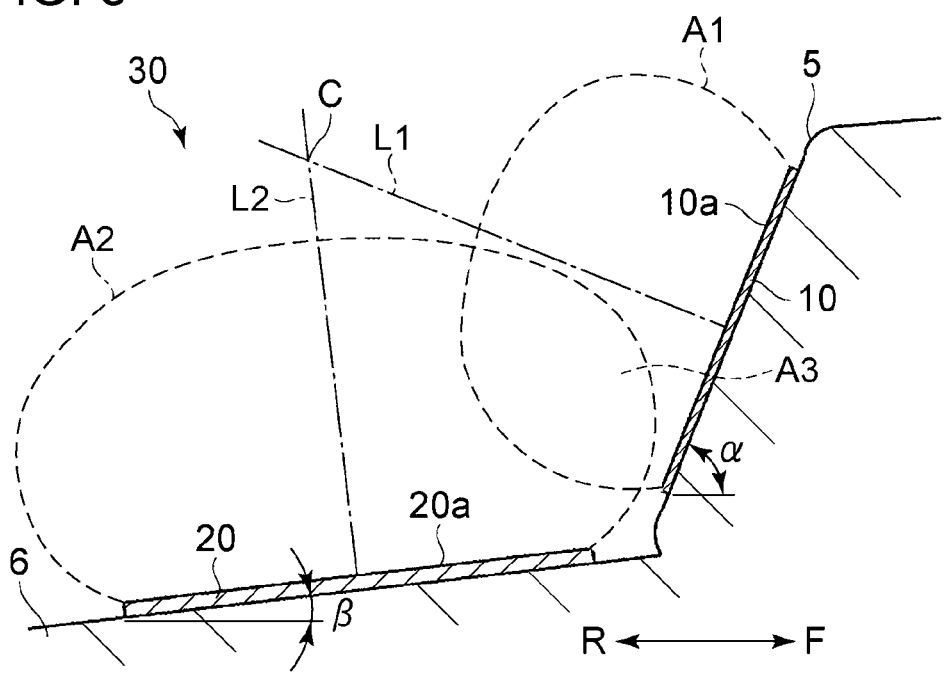

OPERATION CONTROL APPARATUS

RELATED APPLICATION

The present application claims priority to Japanese Patent Application Number 2020-063631, filed Mar. 31, 2020, the entirety of which is hereby incorporated by reference.

BACKGROUND

1. Field of the Invention

The present invention relates to an operation control apparatus that controls an operation device by using a spatial sensing function of two operation detection units.

2. Description of the Related Art

Japanese Unexamined Patent Application Publication No. 2016-9300 describes technology that relates to an input device for vehicles.

The input device for vehicles includes a detection unit on a side surface of a gauge hood disposed in front of a driver's seat of a vehicle and a display device on a side of the gauge hood and near a center portion of the vehicle. Specifically, the detection unit is disposed on a side of a space between the display device and a driver on the driver's seat.

The detection unit is a sensor capable of detecting a spatial input and outputs a detection result obtained in accordance with a movement of a palm or a fingertip of the driver as a signal. The display device is constituted by a liquid crystal panel or an organic electroluminescence (EL) panel and includes an input screen having a plurality of button icons displayed therein. The detection unit detects a movement of a finger of a driver which extends to a space between the display device and the driver's seat and which is moved toward the display device, and therefore, the driver may perform an instinctive input operation on the display device in a position away from the display device while looking at the display device.

According to the technology described in Japanese Unexamined Patent Application Publication No. 2016-9300, the sensor is the detection unit provided only for detecting a movement of a hand or a finger in the space, and therefore, the number of components is increased due to the sensor. Furthermore, since various devices are disposed in positions around the front of the driver's seat, it is difficult to ensure a space for disposing the sensor only for detecting a movement of a hand or a finger. Although the position of the detection unit for disposition is limited to the side surface of the gauge hood according to the technology described in Japanese Unexamined Patent Application Publication No. 2016-9300, the space for disposing the sensor serving as the detection unit may not be available on the side surface of the gauge hood depending on a vehicle type.

SUMMARY

The present disclosure is made to address the foregoing problems and an object of the present disclosure is to provide a control operation apparatus capable of controlling an operation device using a spatial sensing function of another operation device having an operation function itself.

According to an embodiment of the present invention, in an operation control apparatus including two operation devices arranged in parallel, each of which includes an operation detection unit and a display unit, at least one of the operation detection units included in the operation devices has a spatial sensing function of detecting a hand of an operator positioned in a space separated from the operation detection unit, and one of the operation devices is controlled in accordance with a detection signal output from the operation detection unit having the spatial sensing function included in the other of the operation devices.

According to the operation control apparatus of the embodiment of the present invention, the operation detection units of the two operation devices may have the spatial sensing function, and at least one of the operation devices may be controlled in accordance with detection signals output from the operation detection units having the spatial sensing function and included in the two operation devices.

According to the operation control apparatus of the embodiment of the present invention, the two operation devices may be installed in a vehicle interior of a vehicle and include a first operation device and a second operation device disposed on a side nearer to the operator relative to the first operation device, and the display unit of the first operation device may be brought into a display operation available state when a hand of the operator is detected by using the spatial sensing function of the operation detection unit of the second operation device.

Alternatively, according to the operation control apparatus of the embodiment of the present invention, the two operation devices may be installed in a vehicle interior of a vehicle and include a first operation device and a second operation device disposed on a side nearer to the operator relative to the first operation device, and the operation detection unit of the first operation device may be brought into a detection operation available state when a hand of the operator is detected by using the spatial sensing function of the operation detection unit of the second operation device.

According to the operation control apparatus of the embodiment of the present invention, the two operation devices may be installed in a vehicle interior of a vehicle and include a first operation device and a second operation device disposed on a side nearer to the operator relative to the first operation device, and one of the first operation device and the second operation device may be controlled in accordance with a detection signal output from the operation detection unit having the spatial sensing function and included in the second operation device and a detection signal output from the operation detection unit having the spatial sensing function and included in the first operation device.

According to the operation control apparatus of the embodiment of the present invention, the first operation device and the second operation device may operate different devices installed in the vehicle.

According to the operation control apparatus of the embodiment of the present invention, a direction of a first operation device and a direction of a second operation device may be set such that a first virtual perpendicular vertically rising from a surface of the first operation device and a second virtual perpendicular vertically rising from a surface of the second operation device intersect with each other.

According to the operation control apparatus of the embodiment of the present invention, one of the two operation devices having respective display units and respective operation detection units may be controlled by the spatial sensing function of the operation detection unit included in the other operation device. Furthermore, the operation device may be controlled by using the spatial sensing function of the two operation devices. Accordingly, accuracy of spatial sensing may be enhanced when compared with the related arts only using a spatial sensing function of a single operation device.

Furthermore, unlike the technology described in Japanese Unexamined Patent Application Publication No. 2016-9300, a sensor only for performing spatial sensing is not required, and therefore, the number of components may be reduced and a space for arranging the sensor only for performing the sensing is not required in a vehicle interior.

BRIEF DESCRIPTION OF THE DRAWINGS

FIG. 2 is a partial enlarged view of the operation control apparatus illustrated in FIG. 1;

FIG. 3 is a sectional view taken along a line III to III in FIG. 2;

DETAILED DESCRIPTION OF THE PREFERRED EMBODIMENTS

Figure 1:
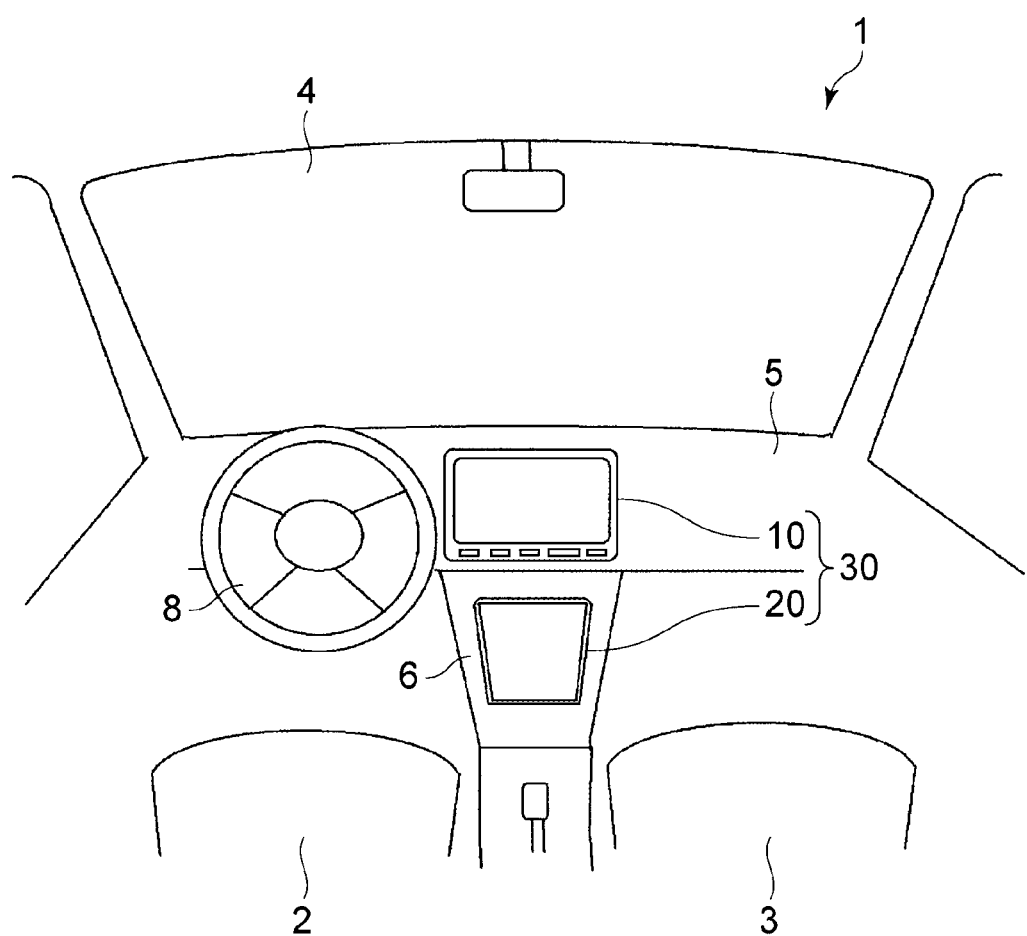
FIG. 1 is a front view of an operation control apparatus installed in a vehicle according to an embodiment of the present invention.

FIG. 1 is a diagram illustrating a structure of a vehicle interior of a vehicle 1. In FIG. 1, a depth direction of the diagram corresponds to a front side in a traveling direction and a near side of the diagram corresponds to a rear side in the traveling direction.

In the vehicle interior, a driver's seat 2 and a passenger seat 3 are provided. A steering wheel 8 is disposed in front of the driver's seat 2. A dashboard 5 is disposed in front of the steering wheel 8, and a windshield 4 is disposed further in front of the dashboard 5. Furthermore, a center console 6 is disposed between the driver's seat 2 and the passenger seat 3.

As illustrated in FIGS. 1 and 2, a first operation device 10 is disposed in a center cluster region at a center of the dashboard 5 in a left-right direction and a second operation device 20 is disposed in front of the center console 6. The first operation device 10 and the second operation device 20 are disposed in parallel in a front-rear direction. An operation control apparatus 30 according to the embodiment of the present invention is constituted by the first operation device 10, the second operation device 20, and circuit units illustrated in a block diagram of FIG. 8.

FIG. 3 is a side view illustrating the arrangement of the first operation device 10 and the second operation device 20. An F direction corresponds to a front side of the vehicle and an R direction corresponds to a rear side. The first operation device 10 and the second operation device 20 may be operated by a hand or a finger of an operator, such as a driver seated on the driver's seat 2 or a passenger seated on the passenger seat 3. The first operation device 10 is located on a front side in an operation direction by the hand or the finger, and the second operation device 20 is located on a near side in the operation direction relative to the first operation device 10.

In FIG. 3, a first virtual perpendicular L1 extending from a surface 10a of the first operation device 10 and a second virtual perpendicular L2 extending from a surface 20a of the second operation device 20 are illustrated. The first virtual perpendicular L1 and the second virtual perpendicular L2 intersect with each other at an intersection portion C in an upper space located in front of the operation devices 10 and 20. Specifically, the surface 10a of the first operation device 10 and the surface 20a of the second operation device 20 face each other at an angle larger than 90 degrees and smaller than 180 degrees, and an operation space that is common to both the operation devices 10 and 20 is formed above the center console 6 (above the second operation device 20). Furthermore, the surface 10a of the first operation device 10 and the surface 20a of the second operation device 20 are obliquely disposed so as to be viewed by the operator. An angle α indicating an inclination of the surface 10a of the first operation device 10 relative to a horizontal direction is larger than an angle β indicating an inclination of the surface 20a of the second operation device 20 relative to the horizontal direction.

Figure 8:
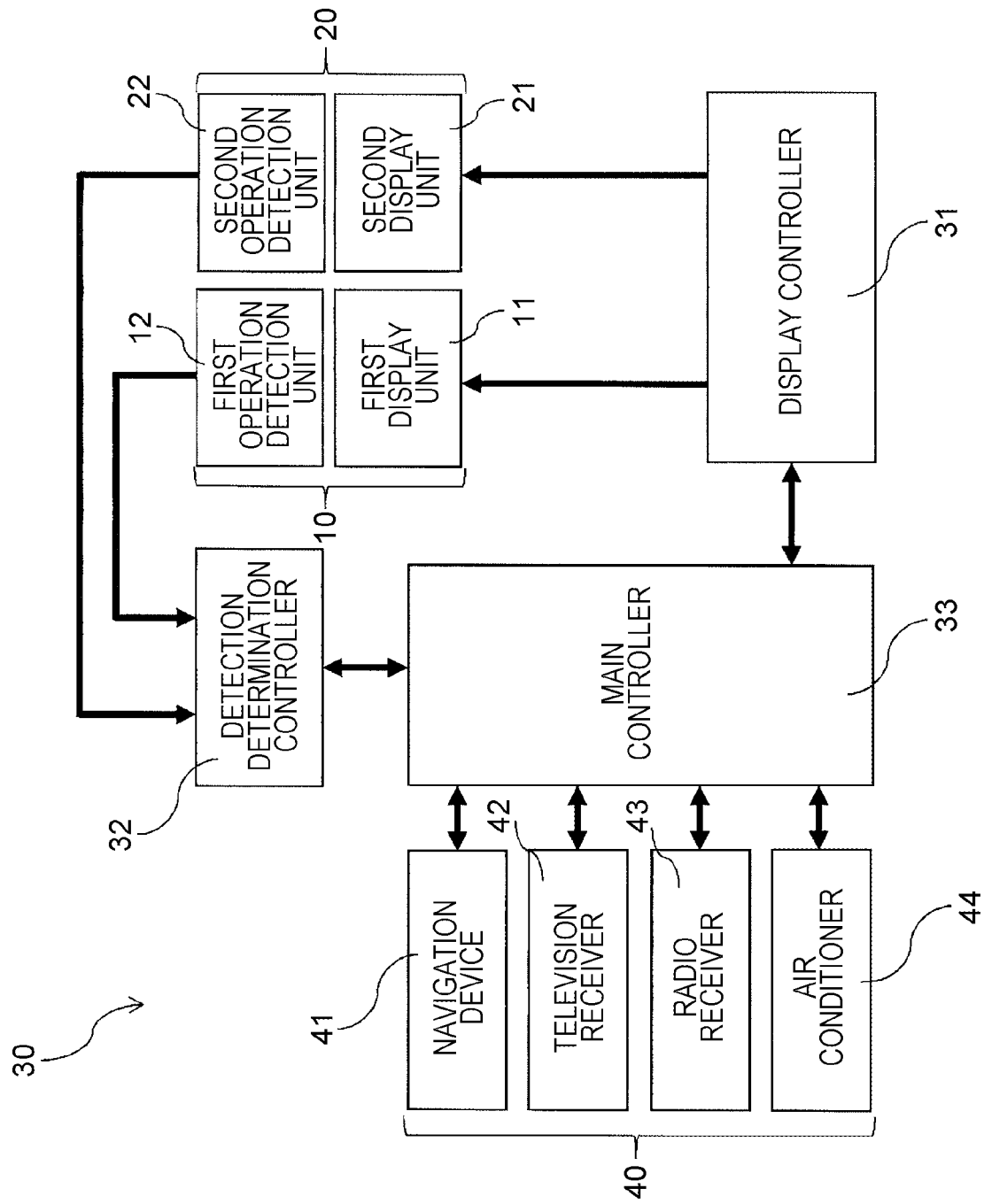
FIG. 8 is a block diagram illustrating a circuit configuration of the operation control apparatus according to the embodiment of the present invention.

As illustrated in FIG. 8, the first operation device 10 includes a first display unit 11 and a first operation detection unit 12, and the second operation device 20 includes a second display unit 21 and a second operation detection unit 22. The first display unit 11 and the second display unit 21 have respective display panels, such as liquid crystal display panels or organic electro luminescence (EL) panels. As illustrated in FIG. 2, a display screen 11a of the display panel is disposed in the surface 10a of the first operation device 10, and a display screen 21a of the display panel is disposed in the surface 20a of the second operation device 20.

The first operation detection unit 12 included in the first operation device 10 is a transparent sensor panel of a capacitance detection type disposed on the display screen 11a. The first operation detection unit 12 includes a plurality of transparent electrodes and detects changes in mutual capacitance between the electrodes and changes in self-capacitance of the individual electrodes so as to output a detection signal based on an operation of a hand of the operator. The first operation detection unit 12 is an approach detection unit having a spatial sensing function of detecting a position or an area of a hand or a movement of the hand in a space separated from the first operation detection unit 12. In FIGS. 3 to 7, a spatial sensing region A1 for detecting a hand by the first operation detection unit 12 is schematically illustrated. The first operation detection unit 12 may detect a coordinate position of a hand of the operator positioned in the spatial sensing region A1, a distance between the hand and the surface 10a, and the like. Furthermore, the first operation detection unit 12 may determine whether a hand has touched the display screen 11a and may detect a coordinate position when a finger has touched the display screen 11a.

The second operation device 20 also has the second operation detection unit 22 in the display screen 21a. The second operation detection unit 22 is a transparent sensor panel of the capacitance detection type similarly to the first operation detection unit 12. The second operation detection unit 22 is also an approach detection unit having a spatial sensing function for detecting a coordinate position of a hand, a distance between the hand and the surface 20a, and the like in the spatial sensing region A2 schematically illustrated in FIGS. 3 to 7. Furthermore, the second operation detection unit 22 may also determine whether a hand has touched the display screen 21a and may also detect a coordinate position when the hand has touched the display screen 21a.

As illustrated in FIG. 2, the first operation device 10 includes a plurality of operation buttons 13 on a lower side of the display screen 11a. The operation buttons 13 include a mechanical switch having a mechanical contact or a sensor of the capacitance detection type detecting a touch of a finger. The operation buttons 13 also function as a portion of the first operation detection unit 12 disposed in the first operation device 10. The second operation device 20 similarly includes such operation buttons 13 as appropriate.

In the operation control apparatus 30 of the present invention, at least one of the first operation detection unit 12 included in the first operation device 10 and the second operation detection unit 22 included in the second operation device 20 has the spatial sensing function. When only one of the operation devices has the spatial sensing function, the second operation detection unit 22 of the second operation device 20 positioned in the front side in the operation direction preferably has the spatial sensing function.

Furthermore, the first operation detection unit 12 and the second operation detection unit 22 having the spatial sensing function are not limited to the sensor panel of the capacitance detection type but may be configured such that a plurality of approach sensors of an optical type or the capacitance detection type are disposed in a plurality of spots surrounding the display screen.

As illustrated in the block diagram of FIG. 8, the display controller 31 generates image signals to be supplied to the first display unit 11 of the first operation device 10 and the second display unit 21 of the second display device 20. A detection signal detected by the first operation detection unit 12 of the first operation device 10 and a detection signal detected by the second operation detection unit 22 of the second operation device 20 are supplied to a detection determination controller 32.

The detection determination controller 32 determines a coordinate position of a hand or a finger of the operator moved to the spatial sensing region A1 illustrated in FIG. 3 and a distance between the hand or the finger and the surface 10a in accordance with the detection signal supplied from the first operation detection unit 12. An area of the hand may be further determined. Furthermore, the detection determination controller 32 also determines whether the finger has touched the display screen 11a and a coordinate position of the touch in accordance with the detection signal supplied from the first operation detection unit 12. The detection determination controller 32 further determines whether one of the operation buttons 13 serving as a portion of the first operation detection unit 12 has been operated. Similarly, the detection determination controller 32 determines a coordinate position of a hand or a finger of the operator moved to the spatial sensing region A2 illustrated in FIG. 3 and a distance between the hand or the finger and the surface 20a in accordance with the detection signal supplied from the second operation detection unit 22. Furthermore, the detection determination controller 32 also determines whether the finger has touched the display screen 21a and a coordinate position of the touch in accordance with the detection signal supplied from the second operation detection unit 22.

As illustrated in FIG. 8, the display controller 31 is controlled by the main controller 33. Furthermore, a determination signal obtained by the detection determination controller 32 is supplied to the main controller 33. The main controller 33 controls a plurality of in-vehicle devices 40 installed in the vehicle 1. The in-vehicle devices 40 according to this embodiment illustrated in FIG. 8 include a navigation device 41, a television receiver 42, a radio receiver 43, and an air conditioner 44. Note that the in-vehicle devices 40 may include various devices, such as a device for changing seat positions of the driver's seat 2 and the passenger seat 3 and an automatic driving control device.

The first operation device 10 and the second operation device 20 operate different devices among the in-vehicle devices 40. Note that a plurality of in-vehicle devices 40 operated by the first operation device 10 and a plurality of in-vehicle devices 40 operated by the second operation device 20 may be partially the same. In the operation controller 30 illustrated in FIG. 8, the first operation device 10 operates the navigation device 41, the television receiver 42, and the radio receiver 43, and the second operation device 20 operates the air conditioner 44.

Next, a control operation performed when the operation controller 30 according to this embodiment of the present invention is operated will be described.

In the operation control apparatus 30 of the present invention, at least one of the first operation detection unit 12 included in the first operation device 10 and the second operation detection unit 22 included in the second operation device 20 has the spatial sensing function that detects a hand or a finger of the operator in the spatial sensing region. Then a movement of the hand or the finger is detected by using the spatial sensing function of one of the operation devices, and the other one of the operation devices is controlled while the movement is recognized as an operation signal. Preferably, both the first operation detection unit 12 included in the first operation device 10 and the second operation detection unit 22 included in the second operation device 20 have the spatial sensing function, and a movement of a hand or a finger that is recognized as an operation signal is detected by using the spatial sensing function of at least one of the operation devices. At least one of the operation devices is controlled by the operation signal.

Hereinafter, concrete steps and a control operation will be described.

The display controller 31 is controlled in accordance with a control operation performed by the main controller 33 illustrated in FIG. 8 to supply an image signal to the first display unit 11 of the first operation device 10 so that a selection icon for activating the navigation device 41, a selection icon for activating the television receiver 42, and a selection icon for activating the radio receiver 43 are displayed in the display screen 11a of the first display unit 11. When one of the selection icons is selected to activate the navigation device 41, a plurality of operation icons for operating the navigation device 41 are displayed in the display screen 11a. Similarly, when the television receiver 42 is activated, a plurality of operation icons for operating the television receiver 42 are displayed in the display screen 11a. When the radio receiver 43 is activated, a plurality of operation icons for operating the radio receiver 43 are displayed in the display screen 11a.

As with the operation of the first operation device 10, an activation icon for activating the air conditioner 44 is displayed in the display screen 21a of the second display unit 21 of the second operation device 20. When the air conditioner 44 is activated, a plurality of operation icons for operating the air conditioner 44 are displayed in the display screen 21a.

When an operation performed by a hand or a finger is detected in at least one of the spatial sensing regions A1 and A2, the detection determination controller 32 determines a position of the hand or the finger, a determination signal is supplied to the main controller 33, and one of the in-vehicle devices 40 corresponding to the operation is operated. Furthermore, also when a finger that has touched the display screen 11a of the first operation device 10 or one of the operation buttons 13 of the first operation device 10 is detected or a finger that has touched the display screen 21a of the second operation device 20 is detected, the detection determination controller 32 supplies a determination signal to the main controller 33 and one of the in-vehicle devices 40 corresponding to the operation is operated.

1. First Operation Example

Figure 4:
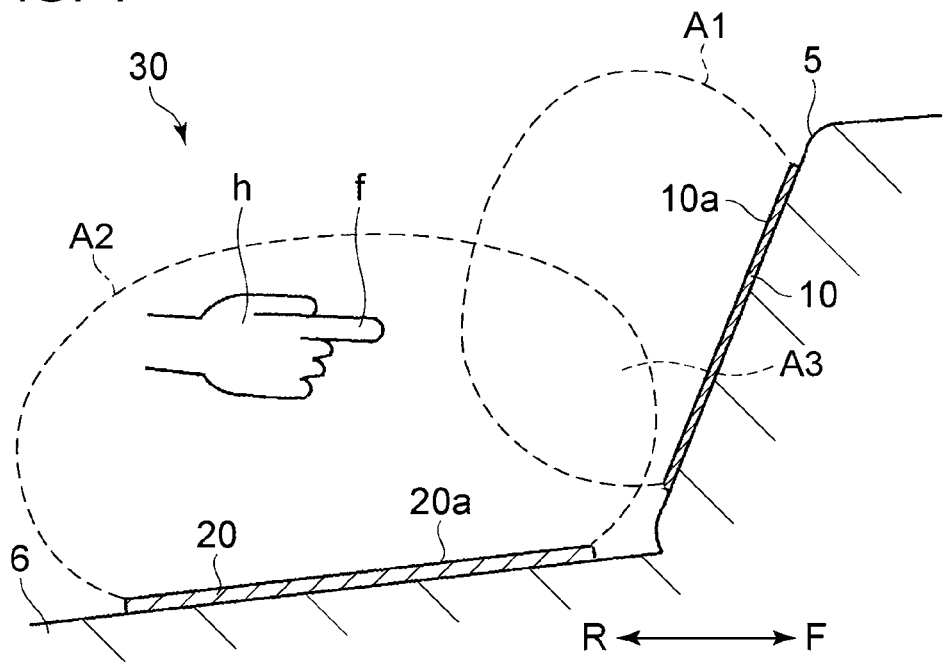
FIG. 4 is a diagram illustrating a first operation example using the control operation apparatus.

A first operation example is illustrated in FIG. 4.

In the first operation example, the first display unit 11 of the first operation device 10 is in a display stop state (or a display halt state) and the first operation detection unit 12 is also in a detection operation stop state (or a detection operation halt state).

As illustrated in FIG. 4, when the second operation detection unit 22 detects a hand h of the operator entering into the spatial sensing region A2 by using the spatial sensing function, the main controller 33 determines that the operator intends to operate the first operation device 10. Therefore, the first display unit 11 of the first operation device 10 is activated and images including the various icons are displayed in the display screen 11a. Simultaneously, the first operation detection unit 12 of the first operation device 10 is activated. When the first operation detection unit 12 is activated, a detection voltage is applied to the electrodes of the first operation detection unit 12 so that the hand or the finger may be detected. After the hand detected in the spatial sensing region A2 is further moved in a front direction F and the activated first operation detection unit 12 detects the movement to the spatial sensing region A1, the main controller 33 determines an operation on the first operation device 10 in accordance with a detection signal supplied from the first operation detection unit 12. An operation of at least one of in-vehicle devices including the navigation device 41, the television receiver 42, and the radio receiver 43 is controlled on the basis of the determination. Furthermore, when a so-called hovering operation is performed by moving, for example, in the left-right direction, the hand h that has been moved into the spatial sensing region A1, an operation of scrolling an image displayed in the display screen 11a may be performed on the basis of a detection signal output from the first operation detection unit 12.

In the first operation example, while the second operation detection unit 22 of the second operation device 20 detects that the hand h or the finger f is included in the spatial sensing region A2, the detection determination controller 32 preferably determines a movement direction of the hand h or the finger f. Only when it is determined that the hand h or the finger f included in the spatial sensing region A2 is moved in the front direction F, the main controller 33 may determine that the operator intends to operate the first operation device 10 and the first display unit 11 of the first operation device 10 may be activated.

Furthermore, in the first operation example, first, the first display unit 11 or the first operation detection unit 12 of the first operation device 10 may be brought to a stop state, and then, when the second operation detection unit 22 determines by using the spatial sensing function that the operator intends to operate the first operation device 10, the first display unit 11 or the first operation detection unit 12 in the stop state may be activated.

In the first operation example, unlike the description above, when the first operation detection unit 12 detects the hand h or the finger f in the spatial sensing region A1 by using the spatial sensing function and determines that the hand h or the finger f moves downward, it may be determined that the operator intends to operate the second operation device 20. In this case, the second display unit 21 of the second operation device 20 may be turned on or the second operation detection unit 22 may be set in a detection operation available state.

2. Second Operation Example

Figure 5:
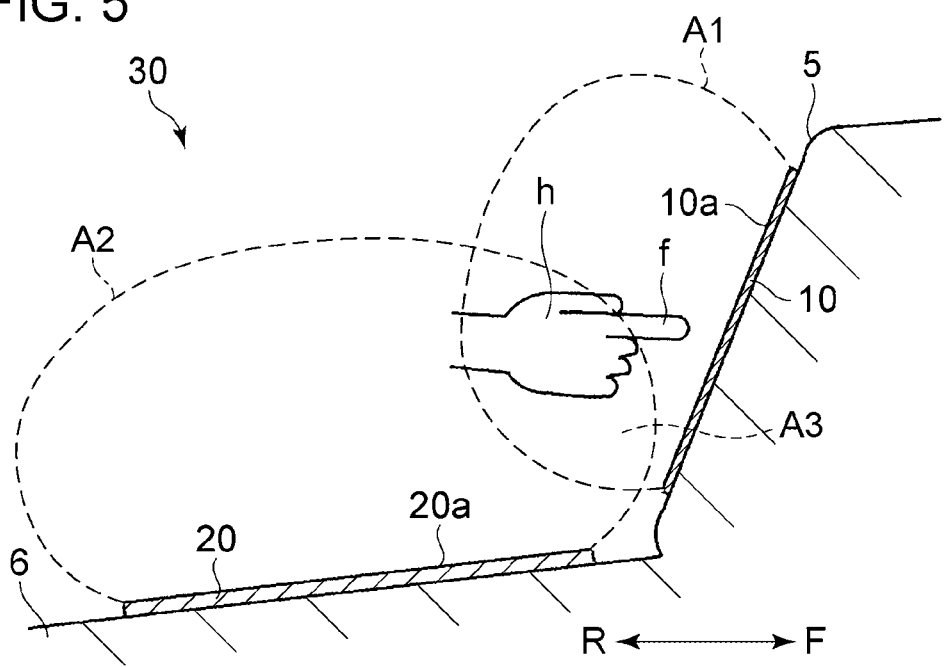
FIG. 5 is a diagram illustrating a second operation example using the control operation apparatus.

A second operation example is illustrated in FIG. 5.

As illustrated in FIG. 3, directions of the first operation device 10 and the second operation device 20 are determined such that the first virtual perpendicular L1 extending from the surface 10a of the first operation device 10 and the second virtual perpendicular L2 extending from the surface 20a of the second operation device 20 intersect with each other, and the rising angle α of the first operation device 10 is larger than the rising angle β of the second operation device 20. As a result, an overlapping spatial sensing region A3 in which the spatial sensing region A1 where the hand h or the finger f may be detected by the spatial sensing function of the first operation detection unit 12 and the spatial sensing region A2 where the hand h or the finger f may be detected by the spatial sensing function of the second operation detection unit 22 overlap with each other is set.

When the so-called hovering operation of moving the hand h or the finger f is performed in the overlapping spatial sensing region A3 while both the first operation detection unit 12 of the first operation device 10 and the second operation detection unit 22 of the second operation device 20 are in the detection operation available state, operation signals may be obtained from both the first operation detection unit 12 and the second operation detection unit 22. In this case, when the main controller 33 sets a mode in which an operation on the first operation device 10 is preferentially performed, a selection of one of the icons displayed in the display screen 11a of the first operation device 10 is performed in accordance with a detection signal supplied from the first operation detection unit 12. In this case, the detection determination controller 32 may analyze a detection signal supplied from the second operation detection unit 22 of the second operation device 20 so as to correct the detection signal supplied from the first operation detection unit 12. When the correction is performed using the detection signal output from the second operation detection unit 22 while the first operation device 10 is operated by the hovering operation, a coordinate position and the like of the hand h or the finger f in a space or the like may be detected with high accuracy. As a result, when the hand h or the finger f is moved in the overlapping space operation region A3, one of the icons displayed in the display screen 11a of the first display unit 11 may be selected with high sensitivity.

On the other hand, when the main controller 33 sets a mode in which an operation on the second operation device 20 is preferentially performed, a selection of one of the icons displayed in the display screen 21a of the second operation device 20 is available when the hand h or the finger f is moved in the overlapping spatial sensing region A3. In this case, the operation to be performed on the second operation device 20 may be corrected using the detection signal supplied from the first operation detection unit 12.

3. Third Operation Example

Figure 6:
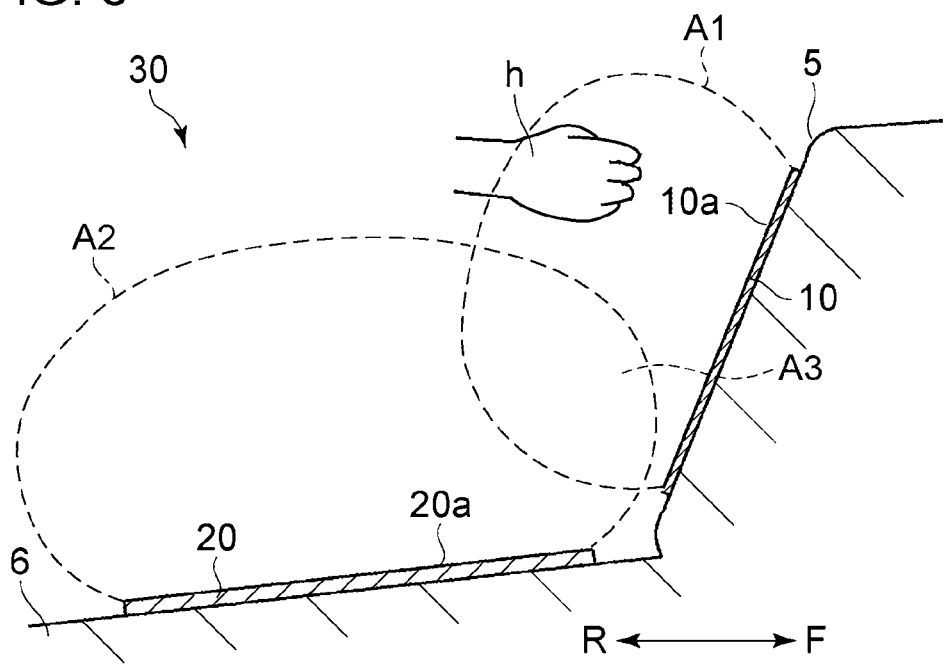
FIG. 6 is a diagram illustrating a third operation example using the control operation apparatus.

A third operation example is illustrated in FIG. 6.

When the hand h or the finger f is moved in the overlapping spatial sensing region A3 in a state in which a mode for preferentially performing an operation on the first operation device 10 is set in the main controller 33, the hovering operation is performed on the first operation device 10 by the spatial sensing function of the first operation detection unit 12. In this case, the main controller 33 continues monitoring of a detection signal output from the second operation detection unit 22 included in the second operation device 20. As illustrated in FIG. 6, when the hand h that has finished the hovering operation is moved upward and the second operation detection unit 22 included in the second operation device 20 detects separation of the hand h from the spatial sensing region A2 (the overlapping spatial sensing region A3), the main controller 33 determines that the operator does not intend to operate the first operation device 10 and brings at least one of the first display unit 11 and the first operation detection unit 12 of the first operation device 10 into the operation stop state.

In the third operation example, it may be determined that the operator does not intend to operate the first operation device 10 on the basis of the detection signal supplied from the second operation detection unit 22 even when the hand h that has been included in the spatial sensing region A1 is recognized by the detection signal supplied from the first operation detection unit 12, and accordingly, an erroneous operation on the first operation detection unit 12 due to an unintentional movement of the hand h in the spatial sensing region A1 may be suppressed.

4. Fourth Operation Example

Figure 7:
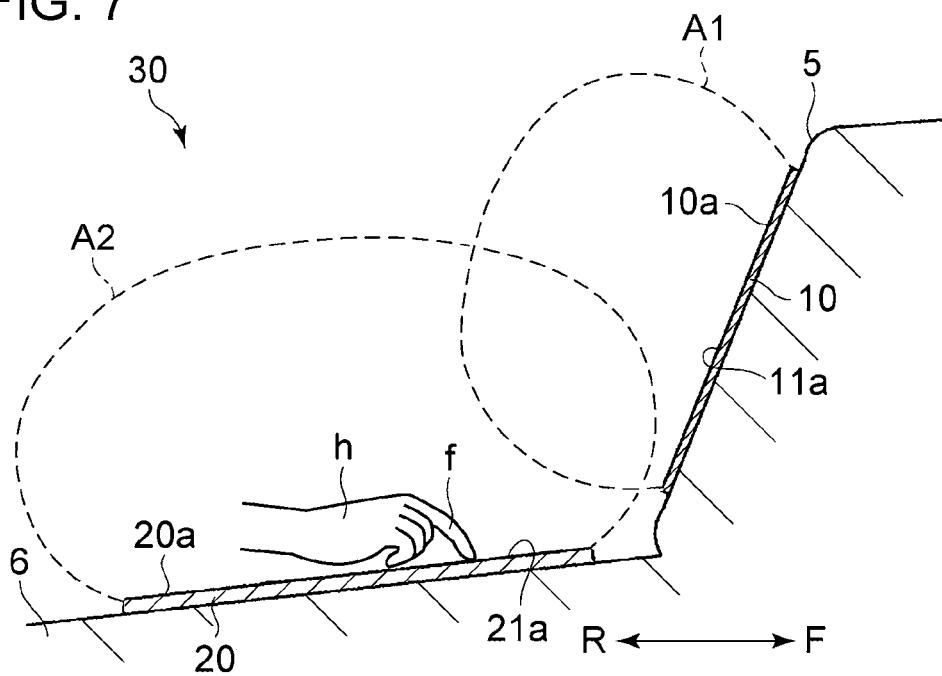
FIG. 7 is a diagram illustrating a fourth operation example using the control operation apparatus.

A fourth operation example is illustrated in FIG. 7.

In a case where the second operation detection unit 22 included in the second operation device 20 is a sensor panel of the capacitance detection type, when the hand h is moved in the spatial sensing region A2, the movement is detected by the second operation detection unit 22, the plurality of icons displayed in the display screen 21a are scrolled, for example, and an operation of selecting one of the icons is performed. As illustrated in FIG. 7, an operation of confirming a selected icon is performed when the finger f approaches or touches the display screen 21a. However, it may be determined that the finger f has approached or touched the display screen 21a although the finger f is positioned far away from the display screen 21a due to a determination error, such as external noise.

To suppress such erroneous detection, the main controller 33 monitors a detection output of the first operation detection unit 12 so as to determine whether the hand h or the finger f is positioned in the overlapping spatial sensing region A3 when the second operation detection unit 22 detects the hand h or the finger f included in the spatial sensing region A2. When the hand h or the finger f is detected in the overlapping spatial sensing region A3, it is determined that the finger f is positioned still far away from the display screen 21a of the second operation device 20 and it is determined that the operation of confirming a selected icon has not been performed. Furthermore, when the finger f approaching the display screen 21a is detected in accordance with a detection signal output from the second operation detection unit 22 and the hand h or the finger f is not included in the overlapping spatial sensing region A3, it is determined that an operation of the finger f approaching the display screen 21a is not an erroneous operation.

Similarly, also when the finger approaching or touching the display screen 11a is detected in the first operation device 10, a detection signal of the second operation detection unit 22 is referred to. In this case, when it is determined that the hand h or the finger f is included in the overlapping spatial sensing region A3, it is determined that the finger f does not approach or touch the display screen 11a of the first operation device 10, and therefore, a detection operation has been performed due to noise. When it is determined that the hand h or the finger f is not included in the overlapping spatial sensing region A3, it is determined that the finger f has approached or touched the display screen 11a.

As described above, the spatial sensing function of the first operation detection unit 12 and the spatial sensing function of the second operation detection unit 22 that is arranged in parallel with the first operation detection unit 12 are operated in combination so that a detection operation may be performed with high accuracy without malfunction at all times.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. An operation control apparatus comprising:
    two operation devices arranged in parallel, each of which includes an operation detection unit and a display unit, wherein
    at least one of the operation detection units included in the operation devices has a spatial sensing function of detecting a hand of an operator positioned in a space separated from the operation detection unit, and
    one of the operation devices is controlled in accordance with a detection signal output from the operation detection unit having the spatial sensing function and included in the other of the operation devices.

2. The operation control apparatus according to claim 1, wherein
    the operation detection units of the two operation devices have the spatial sensing function, and
    at least one of the operation devices is controlled in accordance with detection signals output from the operation detection units having the spatial sensing function and included in the two operation devices.

3. The operation control apparatus according to claim 1, wherein
    the two operation devices are installed in a vehicle interior of a vehicle and include a first operation device and a second operation device disposed on a side nearer to the operator relative to the first operation device, and
    the display unit of the first operation device is brought into a display operation available state when a hand of the operator is detected by using the spatial sensing function of the operation detection unit of the second operation device.

4. The operation control apparatus according to claim 1, wherein
the two operation devices are installed in a vehicle interior of a vehicle and include a first operation device and a second operation device disposed on a side nearer to the operator relative to the first operation device, and
the operation detection unit of the first operation device is brought into a detection operation available state when a hand of the operator is detected by using the spatial sensing function of the operation detection unit of the second operation device.

5. The operation control apparatus according to claim 2, wherein
the two operation devices are installed in a vehicle interior of a vehicle and include a first operation device and a second operation device disposed on a side nearer to the operator relative to the first operation device, and
one of the first operation device and the second operation device is controlled in accordance with a detection signal output from the operation detection unit having the spatial sensing function and included in the second operation device and a detection signal output from the operation detection unit having the spatial sensing function and included in the first operation device.

6. The operation control apparatus according to claim 3, wherein
the first operation device and the second operation device operate different devices installed in the vehicle.

7. The operation control apparatus according to claim 1, wherein
a direction of a first operation device and a direction of a second operation device are set such that a first virtual perpendicular vertically rising from a surface of the first operation device and a second virtual perpendicular vertically rising from a surface of the second operation device intersect with each other.

8. An operation control apparatus comprising:
two operation devices arranged in proximity to one another, each of which includes an operation detection unit and a display unit, wherein
at least one of the operation detection units included in the operation devices has a spatial sensing function of detecting at least a portion of a hand of an operator positioned in a space separated from the operation detection unit, and
one of the operation devices is controlled in accordance with a detection signal output from the operation detection unit having the spatial sensing function and included in the other of the operation devices.

9. The operation control apparatus according to claim 8, wherein
the operation detection units of the two operation devices have the spatial sensing function, and
at least one of the operation devices is controlled in accordance with detection signals output from the operation detection units having the spatial sensing function and included in the two operation devices.

10. The operation control apparatus according to claim 8, wherein
the two operation devices are installed in a vehicle interior of a vehicle and include a first operation device and a second operation device disposed on a side nearer to the operator relative to the first operation device, and
the display unit of the first operation device is brought into a display operation available state when a portion of the hand of the operator is detected by using the spatial sensing function of the operation detection unit of the second operation device.

11. The operation control apparatus according to claim 8, wherein
the two operation devices are installed in a vehicle interior of a vehicle and include a first operation device and a second operation device disposed on a side nearer to the operator relative to the first operation device, and
the operation detection unit of the first operation device is brought into a detection operation available state when a portion of the hand of the operator is detected by using the spatial sensing function of the operation detection unit of the second operation device.

12. The operation control apparatus according to claim 9, wherein
the two operation devices are installed in a vehicle interior of a vehicle and include a first operation device and a second operation device disposed on a side nearer to the operator relative to the first operation device, and
one of the first operation device and the second operation device is controlled in accordance with a detection signal output from the operation detection unit having the spatial sensing function and included in the second operation device and a detection signal output from the operation detection unit having the spatial sensing function and included in the first operation device.

13. The operation control apparatus according to claim 10, wherein
the first operation device and the second operation device operate different devices installed in the vehicle.

14. The operation control apparatus according to claim 8, wherein
a direction of a first operation device and a direction of a second operation device are set such that a first virtual perpendicular vertically rising from a surface of the first operation device and a second virtual perpendicular vertically rising from a surface of the second operation device intersect with each other.

15. An operation control apparatus comprising:
two operation devices, each of which includes an operation detection unit and a display unit, wherein
a first virtual perpendicular rising from a surface of the first operation device and a second virtual perpendicular rising from a surface of the second operation device intersect with each other;
at least one of the operation detection units included in the operation devices has a spatial sensing function of detecting an extension of an operator positioned in a space separated from the operation detection unit, and
one of the operation devices is controlled in accordance with a detection signal output from the operation detection unit having the spatial sensing function and included in the other of the operation devices.

16. The operation control apparatus according to claim 15, wherein
the operation detection units of the two operation devices have the spatial sensing function, and
at least one of the operation devices is controlled in accordance with detection signals output from the operation detection units having the spatial sensing function and included in the two operation devices.

17. The operation control apparatus according to claim 15, wherein the two operation devices are installed in a vehicle interior of a vehicle and include a first operation device and a second operation device disposed on a side nearer to the operator relative to the first operation device, and the display unit of the first operation device is brought into a display operation available state when the extension of the operator is detected by using the spatial sensing function of the operation detection unit of the second operation device.

18. The operation control apparatus according to claim 15, wherein the two operation devices are installed in a vehicle interior of a vehicle and include a first operation device and a second operation device disposed on a side nearer to the operator relative to the first operation device, and the operation detection unit of the first operation device is brought into a detection operation available state when the extension of the operator is detected by using the spatial sensing function of the operation detection unit of the second operation device.

19. The operation control apparatus according to claim 16, wherein the two operation devices are installed in a vehicle interior of a vehicle and include a first operation device and a second operation device disposed on a side nearer to the operator relative to the first operation device, and one of the first operation device and the second operation device is controlled in accordance with a detection signal output from the operation detection unit having the spatial sensing function and included in the second operation device and a detection signal output from the operation detection unit having the spatial sensing function and included in the first operation device.

20. The operation control apparatus according to claim 17, wherein the first operation device and the second operation device operate different devices installed in the vehicle.

* * * * *